(12) United States Patent
Weng et al.

(10) Patent No.: US 10,520,833 B1
(45) Date of Patent: Dec. 31, 2019

(54) EXTREME ULTRAVIOLET LITHOGRAPHY SYSTEM

(71) Applicant: Taiwan Semiconductor Manufacturing Co., Ltd., Hsinchu (TW)

(72) Inventors: Ming-Hui Weng, New Taipei (TW); Cheng-Han Wu, Taichung (TW); Ching-Yu Chang, Yilang County (TW); Chin-Hsiang Lin, Hsin-chu (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 0 days.

(21) Appl. No.: 16/035,354

(22) Filed: Jul. 13, 2018

(51) Int. Cl.
*G03B 27/58* (2006.01)
*G03F 7/20* (2006.01)

(52) U.S. Cl.
CPC ................ *G03F 7/70708* (2013.01)

(58) Field of Classification Search
CPC ............. G03F 7/70708; G03F 7/70941; G03F 7/70325; G03F 7/70375
See application file for complete search history.

(56) References Cited

U.S. PATENT DOCUMENTS

| | | | |
|---|---|---|---|
| 8,796,666 B1 | 8/2014 | Huang et al. | |
| 8,841,047 B2 | 9/2014 | Yu et al. | |
| 8,877,409 B2 | 11/2014 | Hsu et al. | |
| 9,093,530 B2 | 4/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,869,934 B2 | 1/2018 | Huang et al. | |
| 9,869,939 B2 | 1/2018 | Yu et al. | |
| 2003/0032302 A1* | 2/2003 | Nishi | G03F 7/38 438/758 |
| 2014/0193755 A1* | 7/2014 | Wise | G03F 7/2004 430/319 |
| 2016/0139503 A1* | 5/2016 | Ramaswamy | G03F 7/20 355/53 |

OTHER PUBLICATIONS

Allessandro Vaglio Pret, "Modeling and Simulation of low-energy electron scattering in organic and inorganic EUV photoresists," Advances in Patterning Materials and Processes XXXIV, vol. 10146 @ 2017 SPIE, 16 pages.
Takahiro Kozawa eta al., "Radiation-Induced Acid Generation Reactions in Chemically Amplifed Resists for Electron Beam and X-Ray Lithography," Japanese Journal of Applied Physics, vol. 31 (1992) pp. 4301-4306, Part 1, No. 12B, Dec. 1992.

* cited by examiner

*Primary Examiner* — Peter B Kim
(74) *Attorney, Agent, or Firm* — Haynes and Boone, LLP

(57) ABSTRACT

Semiconductor systems, apparatuses and methods are provided. In one embodiment, an extreme ultraviolet lithography system includes a substrate stage configured to secure a substrate at a first vertical level, wherein the substrate is deposited with a resist layer thereon; at least one electrode positioned at a second vertical level above the first vertical level; and a power source configured to apply an electric field across the at least one electrode and the substrate stage, including across a thickness of the resist layer when the substrate is secured on the substrate stage.

20 Claims, 15 Drawing Sheets

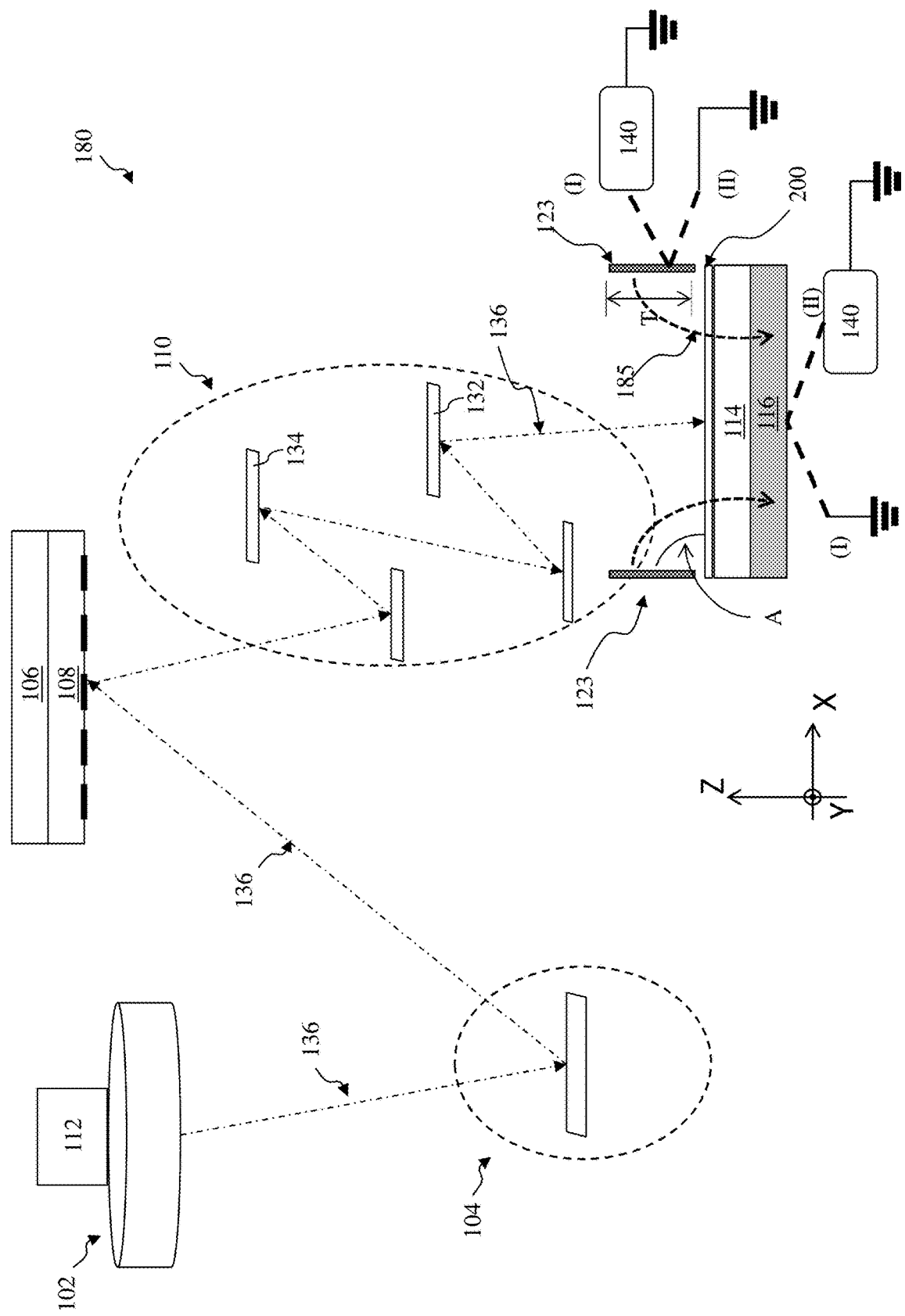

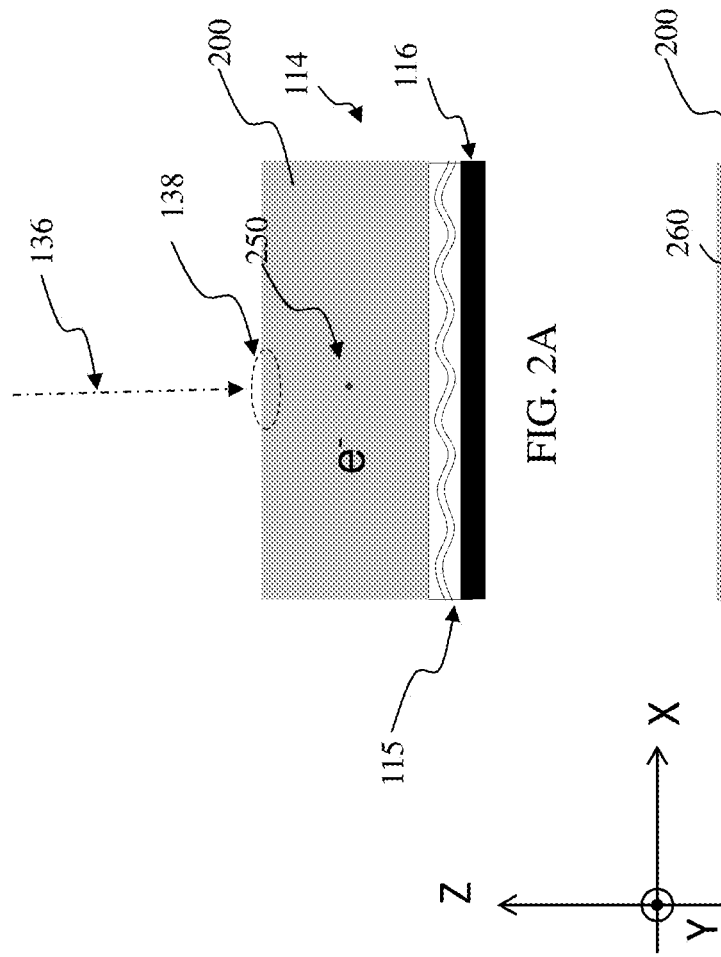

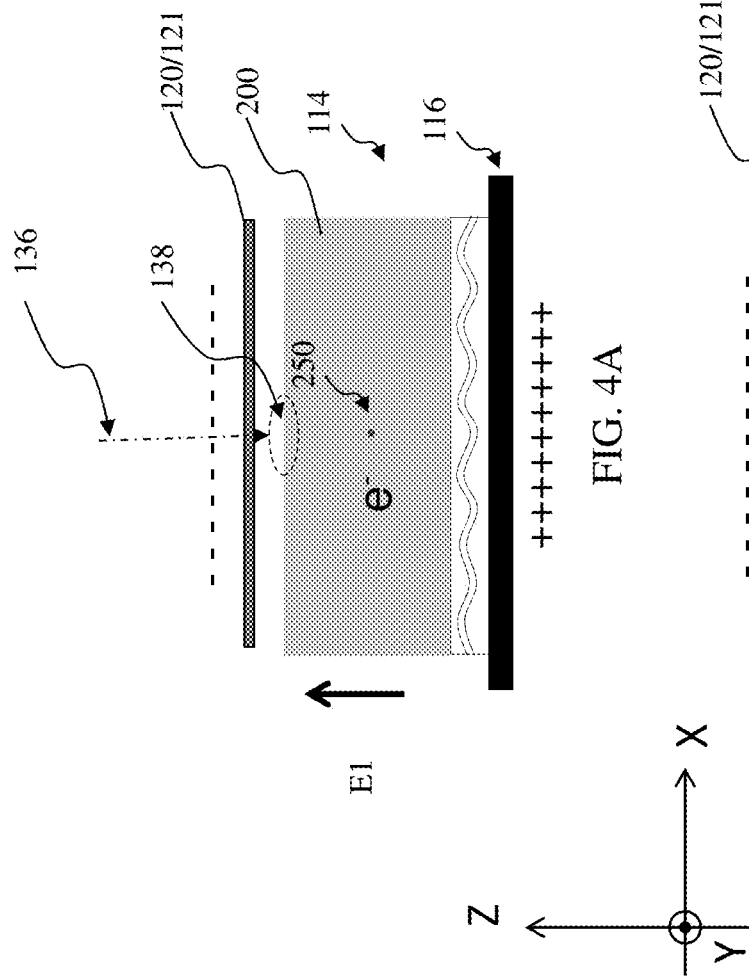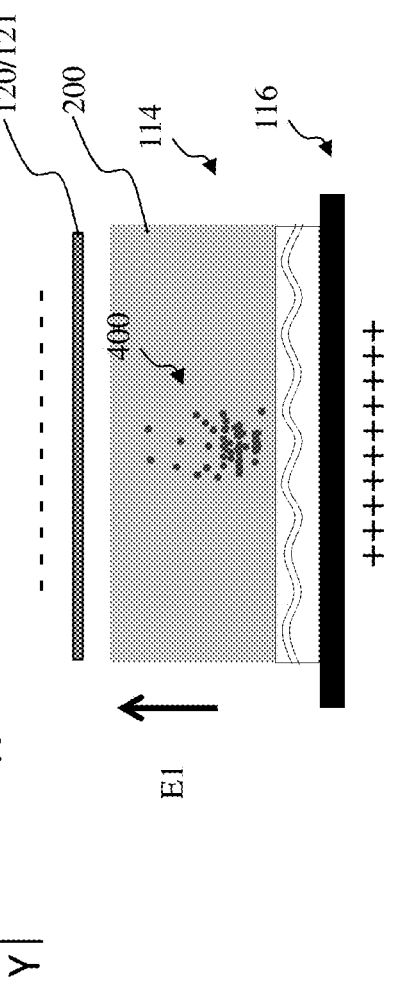
FIG. 4A
FIG. 4B

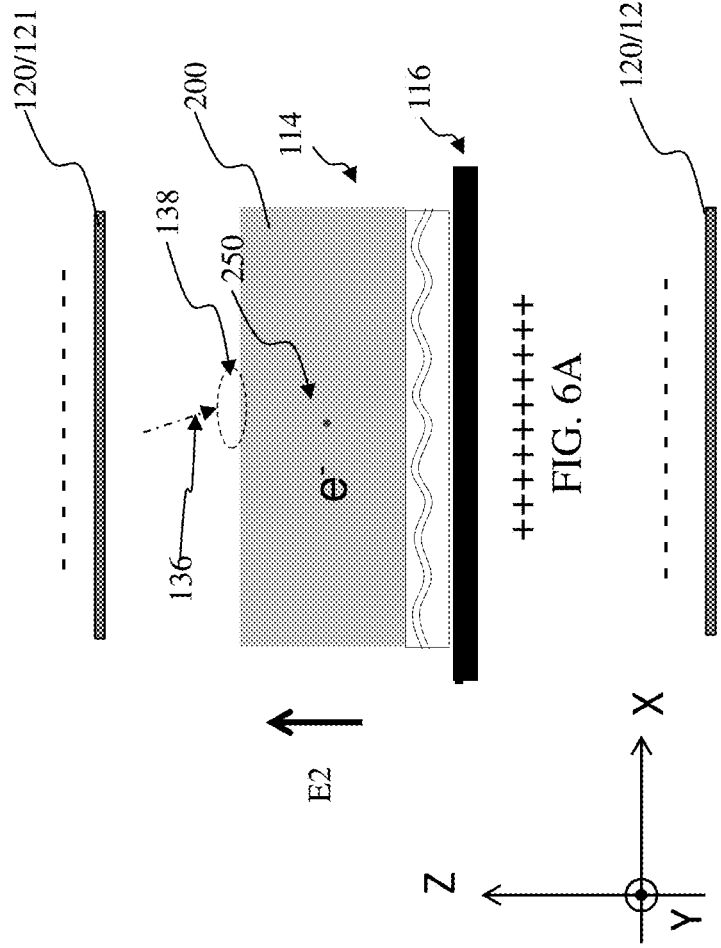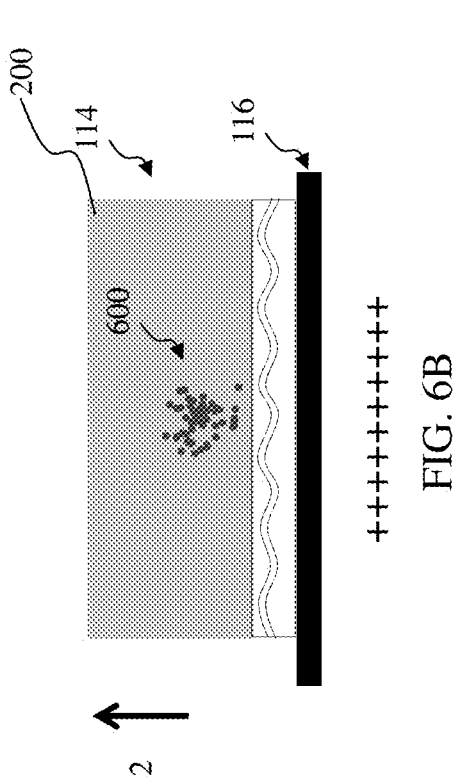
FIG. 6A
FIG. 6B

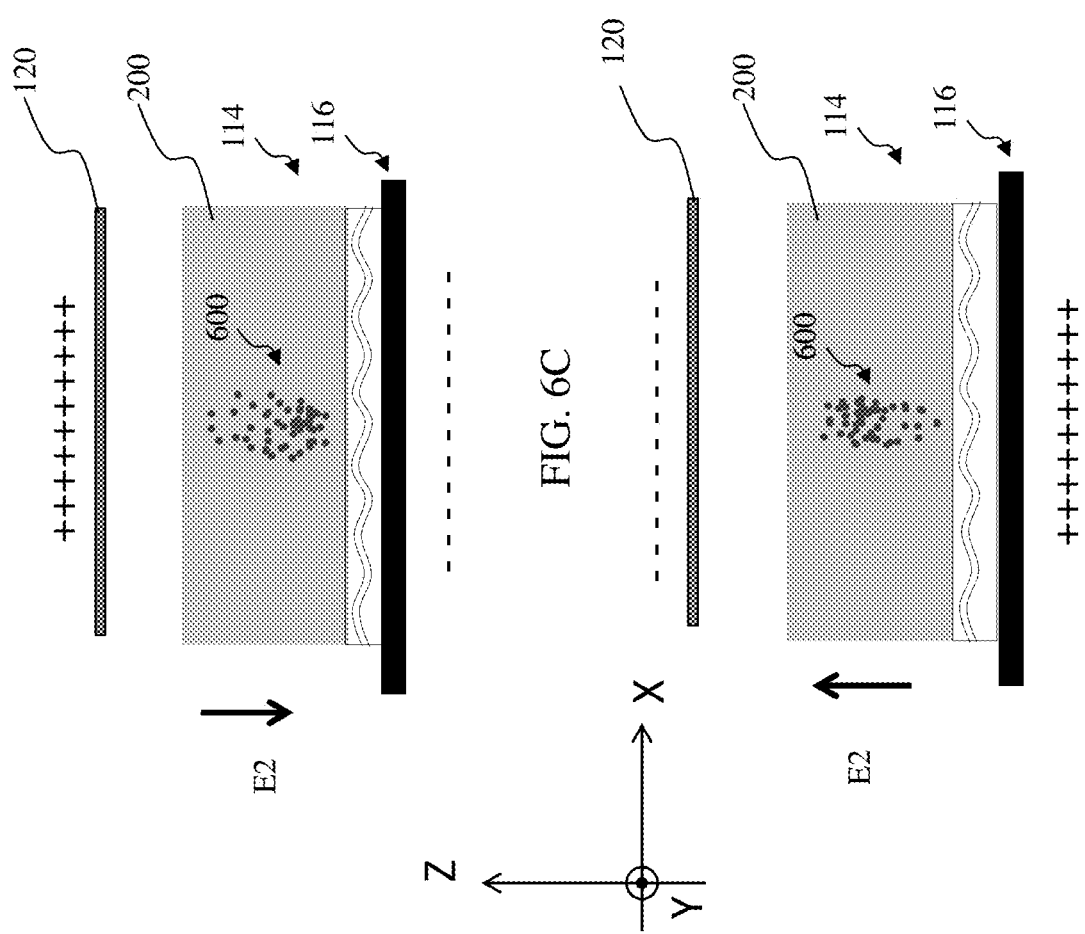

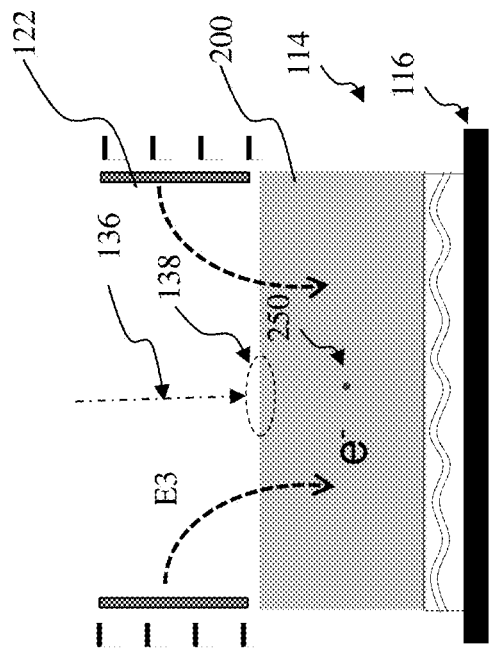
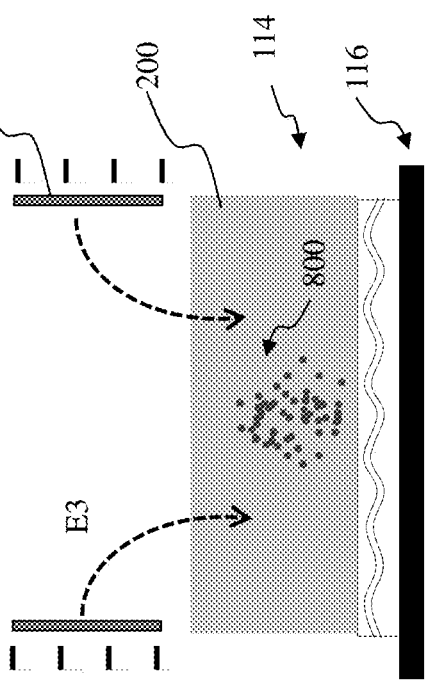
FIG. 8A
FIG. 8B

EXTREME ULTRAVIOLET LITHOGRAPHY SYSTEM

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, extreme ultraviolet (EUV) lithography has become an important technique for implementing high-resolution lithography processes. While existing EUV lithography apparatuses and methods have been generally adequate, they have not been entirely satisfactory in every aspect. For example, EUV from EUV lithography system may generate electron blur in the resist layer, reducing the resolution. Thus, improvements in this aspect are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A-2 is a diagrammatic schematic view of another embodiment of a lithography system in accordance with various aspects of the present disclosure.

FIG. 1B-1 is a diagrammatic schematic view of an embodiment of a lithography system in accordance with various aspects of the present disclosure.

FIG. 1B-2 is a diagrammatic schematic view of another embodiment of a lithography system in accordance with various aspects of the present disclosure.

FIG. 1C-1 is a diagrammatic schematic view of an embodiment of a lithography system in accordance with various aspects of the present disclosure.

FIG. 1C-2 is a diagrammatic schematic view of another embodiment of a lithography system in accordance with various aspects of the present disclosure.

FIG. 2A is a schematic cross-sectional view of a resist layer being radiated by EUV in a lithography system in accordance with various aspects of the present disclosure, with the electric field shut off.

FIG. 2B is a schematic cross-sectional view of a secondary electron distribution in a resist layer being radiated by EUV radiation in a lithography system in accordance with various aspects of the present disclosure, with the electric field shut off.

FIG. 4A illustrates a schematic cross-sectional view of a resist layer being radiated by EUV radiation in a lithography system in accordance with various aspects of the present disclosure.

FIG. 4B illustrates a schematic cross-sectional view of a secondary electron distribution in a resist layer being radiated by EUV radiation in a lithography system in accordance with various aspects of the present disclosure.

FIG. 6A illustrates a schematic cross-sectional view of a resist layer being radiated by EUV radiation in a lithography system in accordance with various aspects of the present disclosure.

FIG. 6B illustrates a schematic cross-sectional view of a secondary electron distribution in a resist layer being radiated by EUV radiation in a lithography system in accordance with various aspects of the present disclosure.

FIG. 6C illustrates a schematic cross-sectional view of a secondary electron distribution in a resist layer being radiated by EUV radiation in a lithography system in accordance with various aspects of the present disclosure.

FIG. 6D illustrates a schematic cross-sectional view of a secondary electron distribution in a resist layer being radiated by EUV radiation in a lithography system in accordance with various aspects of the present disclosure.

FIG. 8A illustrates a schematic cross-sectional view of a resist layer being radiated by EUV radiation in a lithography system in accordance with various aspects of the present disclosure.

FIG. 8B illustrates a schematic cross-sectional view of a secondary electron distribution in a resist layer being radiated by EUV radiation in a lithography system in accordance with various aspects of the present disclosure.

DETAILED DESCRIPTION

Figures 1, 1A:
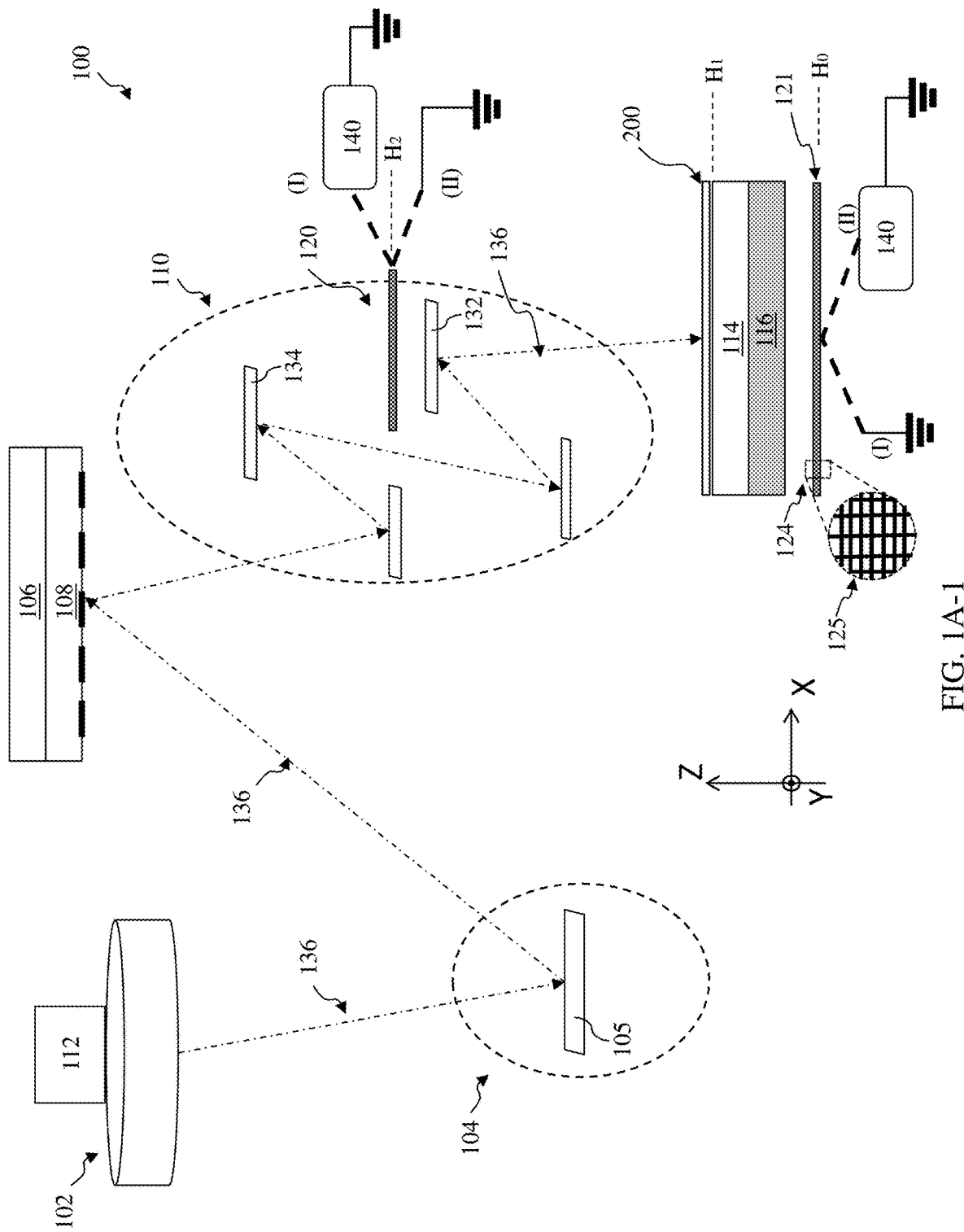
FIG. 1A-1 is a diagrammatic schematic view of an embodiment of a lithography system in accordance with various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a lithography system. In a lithography system, photons in a radiation, such as EUV radiation, generate photo-electrons in the resist layer being irradiated. The photo-electron may travel within the resist layer and create scattering secondary electrons. Some of the photo-electrons and the secondary electrons may be captured by photo-acid generators (PAGs) to generate an acid that has a spatial distribution within the resist layer. The acid may then cause de-protection reaction in the distribution area which may then be developed by use of a developer. The spatial distribution of the generated acid impacts the resolution of the lithography system and when not controlled, may result in line edge roughness (LER). As this spatial distribution of acid is mainly caused by secondary electrons, this phenomenon is referred to as secondary electron blur (SEB). The present disclosure contemplates apparatuses and methods for controlling the electron distribution in an irradiated resist layer, thereby alleviating SEB.

FIG. 1A-1 is a schematic diagram of a lithography system 100 according to some embodiments of the present disclosure. The lithography system 100 may also be generically referred to as a scanner that is operable to perform lithography exposing processes with respective radiation source and exposure mode. In the present embodiment, the lithography system 100 is an EUV lithography system designed to expose a resist layer 200 deposited on a semiconductor substrate 114 with EUV light 136. The resist layer 200 includes a suitable material sensitive to the EUV light 136. The lithography system 100 employs a radiation source (or "radiation source vessel") 102 in which EUV light (or "EUV radiation") 136 is generated. In some embodiments, the EUV light 136 has a wavelength ranging between about 1 nm and about 100 nm. In one particular example, the radiation source generates an EUV light 136 with a wavelength centered at about 13.5 nm. Accordingly, the radiation source 102 is also referred to as an EUV radiation source 102. In an embodiment, the EUV radiation source 102 utilizes laser-produced plasma to generate the EUV radiation 136. In the present embodiment, the lithography system 100 further includes a metrology system 112 configured to monitor the EUV radiation 136 (e.g., intensity or energy) and/or the plasma generated from a target material to produce the EUV radiation 136 in the source vessel 102.

The lithography system 100 also employs an illuminator 104. In some embodiments, the illuminator 104 includes various refractive optic components, such as a single lens or a lens system having multiple lenses (zone plates) or alternatively, reflective optics (for EUV lithography system), such as a single mirror or a mirror system having multiple mirrors, in order to direct light from the radiation source 102 onto a mask stage 106. In the present embodiment where the radiation source 102 generates light in the EUV wavelength range, reflective optics is employed in the illuminator 104.

The lithography system 100 also includes the mask stage 106 configured to secure an EUV lithography mask (or "mask") 108. In some embodiments, the mask stage 106 includes an electrostatic chuck (e-chuck) to secure the mask 108. In the present disclosure, the terms "mask," "photomask," and "reticle" are used interchangeably. In the present embodiment, the mask 108 is a reflective mask. The mask 108 may include a substrate comprising a suitable material such as a low thermal expansion material (LTEM) or fused quartz and reflective multilayers (ML) deposited on the substrate, where the ML include a plurality of film pairs, such as molybdenum-silicon (Mo/Si) or molybdenum-beryllium (Mo/Be) film pairs (e.g., a layer of molybdenum above or below a layer of silicon in each film pair) configured to be highly reflective of EUV light 136. The mask 108 may further include a capping layer, such as ruthenium (Ru), and an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The lithography system 100 also includes a projection optics box (POB) (or a "projection optics module") 110 for imaging a pattern of the mask 108 onto the semiconductor substrate 114 secured on a substrate stage 116 of the lithography system 100. In the present embodiment, the POB comprises reflective optics for projecting the EUV light 136. The EUV light 136, which carries the image of the pattern defined on the mask 108, is directed from the mask 108 and collected by the POB 110. In various embodiments, the illuminator 104 and the POB 110 are collectively referred to as the optical module of the lithography system 100.

In some embodiments represented in FIG. 1A-1, the semiconductor substrate 114 is a semiconductor wafer, such as a silicon wafer or other type of wafer to be patterned. The semiconductor substrate 114 is coated with the resist layer 200 sensitive to the EUV radiation 136. It is understood that various components including though not limited to those described above may be integrated together and operable to perform lithography exposing processes. In some implementations, the semiconductor substrate 114 is secured to a wafer stage 116 (or substrate stage 116).

In some embodiments, the lithography system 100 may include an electrode 120 and an electrode 121. The electrode 120 may be positioned over the substrate stage 116, including over the semiconductor substrate 114 when the semiconductor substrate 114 is secured on the substrate stage 116. The electrode 120 may also be referred to as the upper electrode 120. The electrode 121 is position below semiconductor substrate 114 and the substrate stage 116 when the semiconductor substrate 114 is secured on the substrate stage 116. In some embodiments represented by (I) in FIG. 1A-1, the upper electrode 120 is electrically coupled to a power source 140 while the lower electrode 121 is grounded. In some implementations, the power source 140 may output either a direct current (DC) signal or an alternating current signal. In some instances, the electrodes 120 and 121 may be made of conductive material and in a form of a plate. The plate-like electrodes 120 and 121 may be of any shape, such as square, rectangular, circular, oval, polygonal, or even irregular shape. In some embodiments, the electrodes 120 and 121 may be in a form of a wire mesh or grid. In those embodiments, the electrodes 120 and 121 are formed of conductive wires arranged as a wire mesh or grid or of a solid conductive plate having through holes distributed thereon. A top view of a region 124 on the electrode 121 is also enlarged in FIG. 1A-1 in a purpose to illustrate the formation of the conductive wire mesh 125. To avoid obstruction of the EUV light 136, the electrode 120 may be placed above one or more optical component of the POB 110 as shown in FIG. 1A-1. The one or more optic components of the POB 110 may be a projection lens or a set of projection lens, such as the exemplary projection lens 132 and 134. In some embodiments, the electrode 120 includes an area that is substantially parallel to the electrode 121 that extends on the X-Y plane. To put it in a different way, the plate-like electrodes 120 and 121 share the same normal direction along the Z direction in some instances. In some embodiments, the electrode 120 is at a vertical level $H_2$ that is higher than the substrate 114 at a vertical level $H_1$, and the electrode 121 is at a vertical level $H_0$ that is lower than the substrate 114 at the vertical level $H_1$. In some embodiments, one or more projection lens in the POB 110, such as the projection lens 134 is vertically above the electrode 120. In some embodiments, one or more projection lens in the POB 110, such as the projection lens 132 is vertically below the electrode 120. In some embodiments, both the electrodes 120 and 121 have X-Y plane areas larger than the area of the semiconductor substrate 114. The larger areas of the electrodes 120 and 121 ensure that the electric field lines in the electric field passing across the thickness of the resist layer 200 are substantially perpendicular to the surface of the semiconductor substrate 114. Namely, large areas of the electrodes 120 and 121 ensure that the electric field lines passing across the thickness of the resist layer 200 are substantially along the Z direction. In some embodiments represented in (II) of FIG. 1A-1, the upper electrode 120 is grounded and the lower electrode 121 is electrically coupled to the power source 140 that may output either DC or AC signal.

As shown in (I) and (II) of FIG. 1A-1, both the electrode not connected to the power source 140 and the power source 140 are grounded, for example, connected to a common ground plane. Consequently, the DC or AC signal supplied by the power source 140 may result in an electric field between the electrodes 120 and 121. In an alternative embodiment not shown in FIG. 1A-1, the output of the power source 140 is electrically coupled to one of the electrodes 120 and 121 and the ground wire of the power source 140 is directly and electrically coupled to the other electrode. In this alternative embodiment, the DC or AC signal supplied by the power source 140 may also create an electric field between the electrodes 120 and 121. When the semiconductor substrate 114 is secured on the substrate stage 116, the electric field created between the electrodes 120 and 121 is perpendicular to a surface of the semiconductor substrate 114, including a surface of the resist layer 200 formed on the semiconductor substrate 114.

Figures 1, 1A, 2:
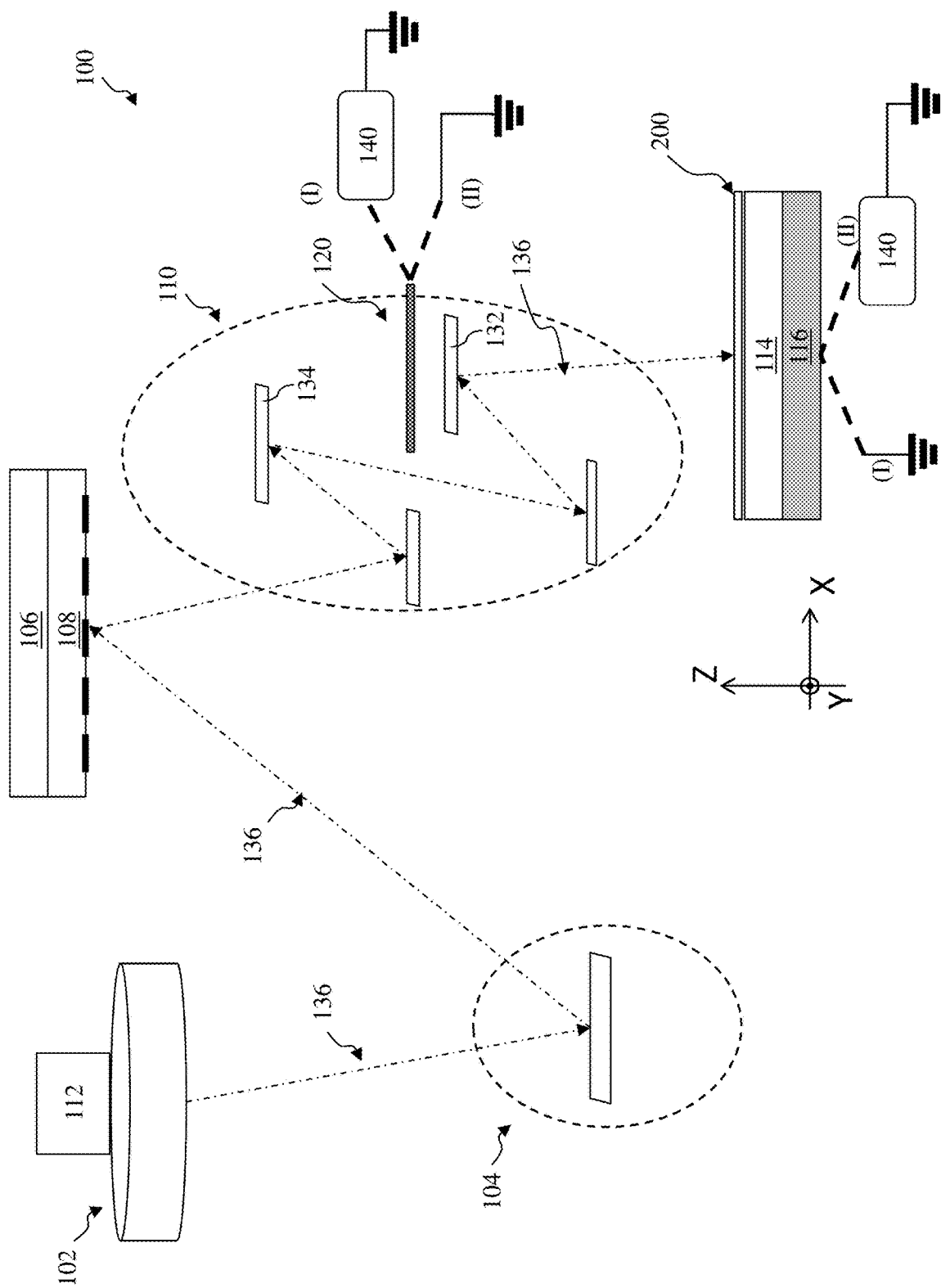

In some embodiments shown in FIG. 1A-2, the substrate stage 116 is made of a conductive material and serves as the lower electrode 121. In those embodiments, a separate lower electrode 121 is not needed. Similar to options (I) and (II) in FIG. 1A-1, one of the upper electrode 120 and the substrate stage 116 may be electrically coupled to a power source 140 that outputs DC or AC signal and the other may be grounded. The DC or AC signal output from the power source 140 may generate an electric field between the upper electrode 120 and the substrate stage 116.

Figures 1, 1B:
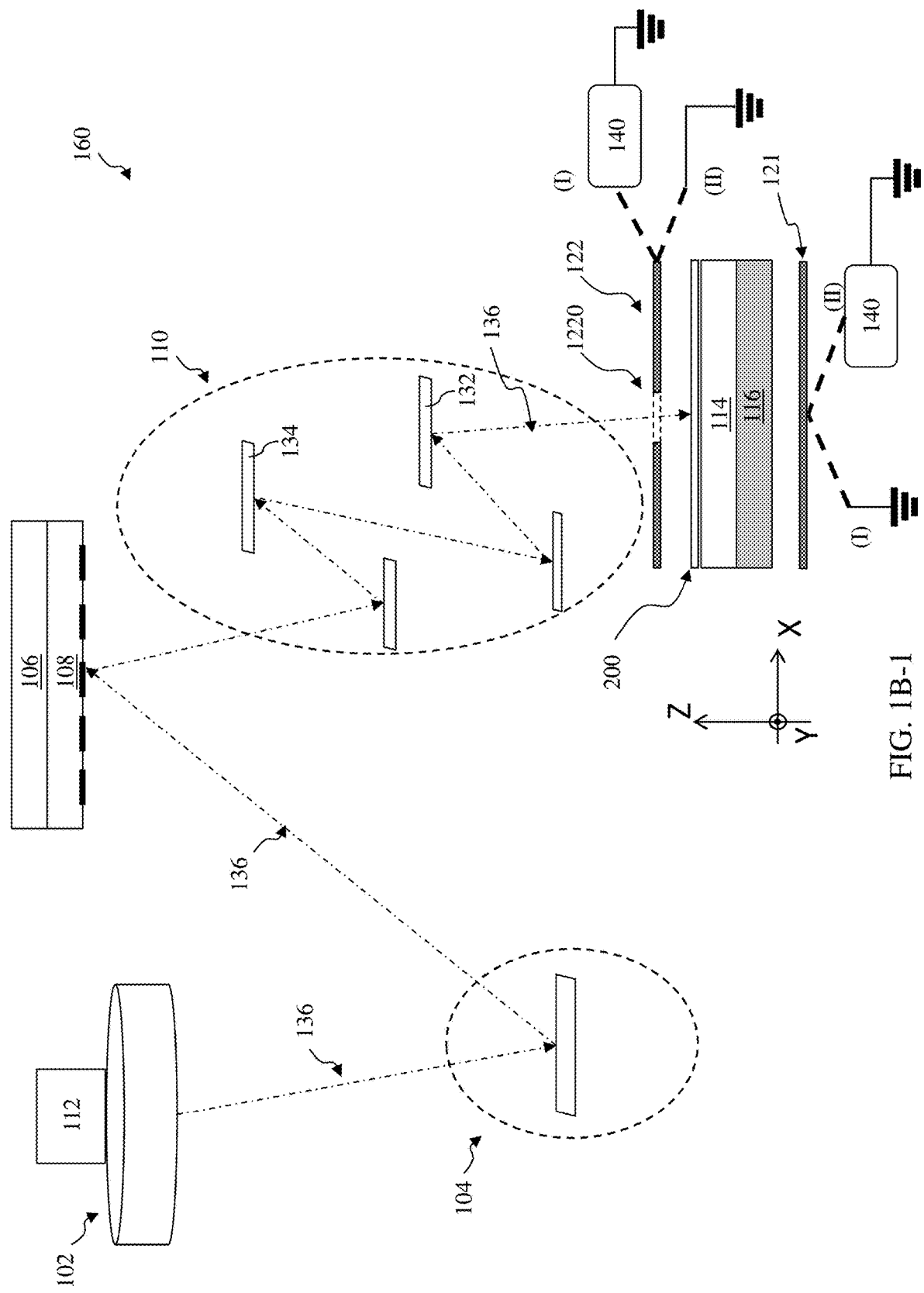
Figures 1, 1B, 2:
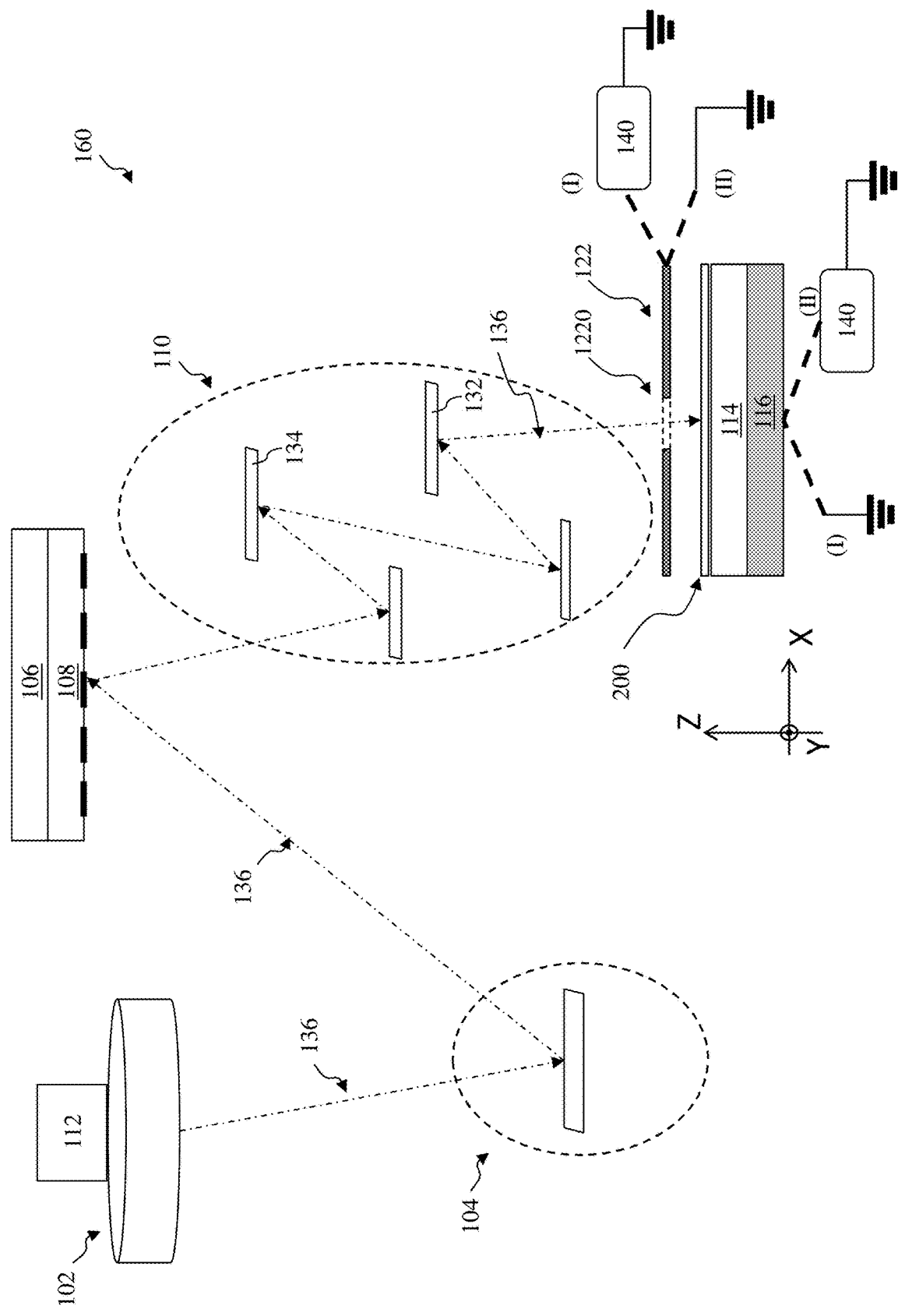

Referring now to FIG. 1B-1, shown therein is a schematic diagram of a lithography system 160 according to some embodiments of the present disclosure. In some embodiments, the lithography system 160 is substantially similar to the lithography system 100 except for the aspects regarding the upper electrode 120. Instead of the electrode 120 in the lithography system 100, the lithography system 160 includes an electrode 122. The electrode 122 may include a through hole 1220 to allow the EUV light 136 to reach the semiconductor substrate 114 in an unhindered manner. In some embodiments, the electrode 122 may be placed below the POB 110 but above the substrate stage 116. The through hole 1220 may be of any shape, including square, rectangular, circular, oval, polygonal, or even an irregular shape. In some embodiments, the electrode 122 may be a wire mesh or a grid and the through hole 1220 may be one of the through holes on the electrode 122.

Similar to options (I) and (II) in FIG. 1A-1, one of the electrode 122 in FIG. 1B-1 and the electrode 121 is electrically coupled to a power source 140 that outputs DC or AC signal and the other may be grounded. The DC or AC signal output from the power source 140 may generate an electric field between the electrode 122 and the lower electrode 121. In some embodiments shown in FIG. 1B-2, the substrate stage 116 is made of a conductive material and serves as the lower electrode 121. In those embodiments, a separate lower electrode 121 is not needed. Similar to options (I) and (II) in FIG. 1A-2, one of the electrode 122 and the substrate stage 116 may be electrically coupled to a power source 140 that outputs DC or AC signal and the other may be grounded. The DC or AC signal output from the power source 140 may generate an electric field between the electrode 122 and the substrate stage 116.

Figures 1, 1C:
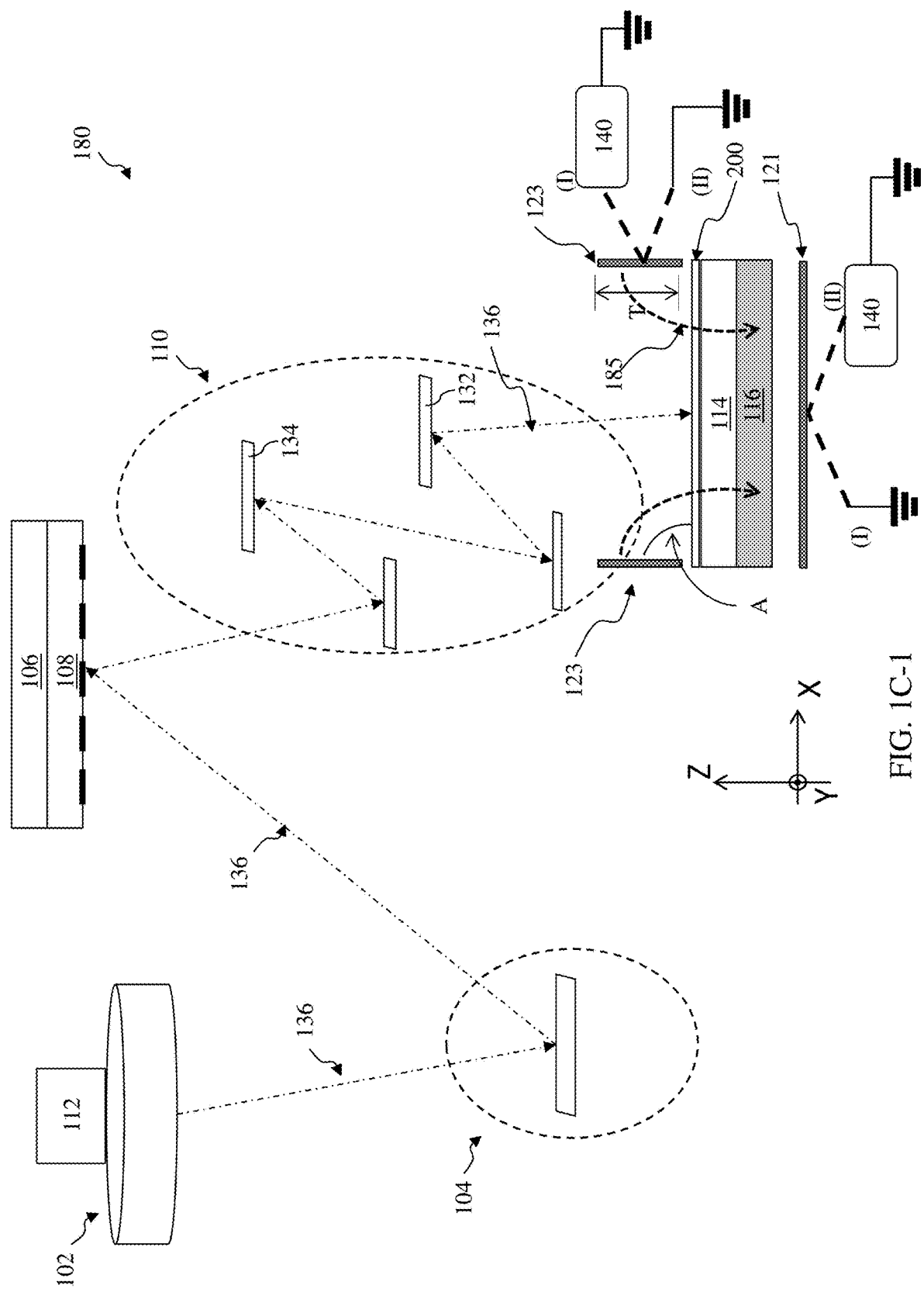

Turning to FIG. 1C-1, shown therein is a schematic diagram of a lithography system 180 according to some embodiments of the present disclosure. In some embodiments, the lithography system 180 is substantially similar to the lithography system 100 except for the aspects regarding the electrode 120 and the electric field. Instead of the upper electrode 120, the lithography system 180 includes an electrode 123 positioned around the edge of the substrate stage 116. The electrode 123 may include one electrode or multiple electrodes electrically coupled together. Similar to options (I) and (II) in FIG. 1A-1, one of the electrodes 123 and 121 may be electrically coupled to the power source 140 and the other is grounded. In some embodiments, because the semiconductor substrate 114 is circular in shape, the substrate stage 116 is also circularly shaped. In those embodiments, the electrode 123 may track the circumference of the substrate stage 116 and assume a form of a ring that is either one-piece or pieced together by two or more ring portions, such as half-rings or quarter-rings. Such a ring extends on the X-Y plane and may have a thickness T along the Z direction. While inner surface (i.e. on the side adjacent to the substrate stage 116) of the electrode 123 shown in FIG. 1C-1 appear to be perpendicular to the top surface of the semiconductor substrate 114, the embodiments of the present disclosure are not so limited. In some embodiments, the inner surface of the electrode 123 and the semiconductor substrate 114 may form an angle A that is smaller than 90 degrees. In some implementations, the angle A may be between about 50 degrees and about 90 degrees. In those embodiments, the electrode 123 may be in a shape of a cylindrical ring or a portion thereof when the angle A is 90 degrees and in a shape of a conical ring when the angle A is less than 90 degrees. The angle A allows the resulting electric field between the electrode 123 and the lower electrode 121 to pass through the semiconductor substrate 114 in a more perpendicular angle while not hindering the EUV radiation 136. In the embodiments represented in FIG. 1C-1, an electric field may be created between the electrode 123 and the substrate stage 116 along a representative direction 185. It is noted that the electrode 123 does not obstruct the EUV radiation 136.

In some embodiments shown in FIG. 1C-2, the substrate stage 116 is made of a conductive material and serves as the lower electrode 121. In those embodiments, a separate lower electrode 121 is not needed. Similar to options (I) and (II) in FIG. 1A-2, one of the electrode 123 and the substrate stage 116 may be electrically coupled to a power source 140 that outputs DC or AC signal and the other may be grounded. The DC or AC signal output from the power source 140 may generate an electric field between the electrode 123 and the substrate stage 116. The electric field may have a representative direction 185 shown in FIG. 1C-2.

FIGS. 2A-2B are schematic cross-sectional views of the resist layer 200 being radiated by EUV in a lithography system in accordance with some embodiments of the present disclosure, such as the lithography systems 100, 160, or 180 in FIG. 1A-1 to FIG. 1C-2, with the electric field shut off. Referring now to FIG. 2A, focus is now turned to the resist layer 200 on the semiconductor substrate 114. It is noted that the semiconductor substrate 114 may include multiple layers or features 115 below the resist layer 200, including but not limited to one or more hard mask layers, one or more anti-reflective layer, one or more etch-stop layers, one or more interconnect layers, one or more semiconductor structures, one or more dielectric layers. The resist layer 200 is formed over the semiconductor substrate 114, including over the multiple layers and features 115. The resist layer 200 may be formed by a spin-coating process and may include components such as a polymer matrix (or polymer backbone), a photo acid generator (PAG), quenchers, chromophore, surfactants, crosslinkers, distilled water, organic solvent, acid labile group (ALG), and other suitable additives and functional groups. When the resist layer 200 is radiated with the EUV radiation 136, electrons will be generated in the resist layer 200 and cause the PAG to release an acid and to initiate a chain reaction. The acid may cleave the ALG off of the polymer matrix in a post exposure bake (PEB) process. The excess acid may be quenched by, for example, a basic quencher. In cases where the ALG increase the hydrophobicity of the polymer matrix, cleavage of the ALG may transform the hydrophobic polymer matrix into hydrophilic polymer matrix. The transformed hydrophilic polymer matrix may dissolve in a developer solution and be removed. Because the acid may change the polymer matrix from being insoluble in the developer solution to being soluble in the developer solution, the acid may be said to have the ability to de-protect the polymer matrix. In some embodiments, the developer solution may be a basic solution, such as a solution containing tetramethylammonium hydroxide (TMAH).

As shown in FIG. 2A, when the resist layer 200 is irradiated by the EUV light 136 in a target exposure area 138, a photon is absorbed by a component of the resist layer 200, such as the polymer matrix, and an electron 250 is generated. Turning to FIG. 2B, the electron 250 in turn impacts various components of the resist layer 200 and generates multiple secondary electrons 260. Without the applied electric field between the electrode 120/121/122 and the substrate stage 116, the secondary electrons 260 are randomly distributed within the resist layer 200 along the X, Y, and Z directions and have a spatial distribution that is larger than the target exposure area 138 on the X-Y plane. Although the EUV generated electron is meant to initiate a chain reaction, the wider than desired distribution of secondary electrons 260 along the X and Y directions may result in SEB and LER. The distribution of secondary electron along the Z direction is desirable as it ensures exposure of the resist layer 200 along its depth.

Figure 3:
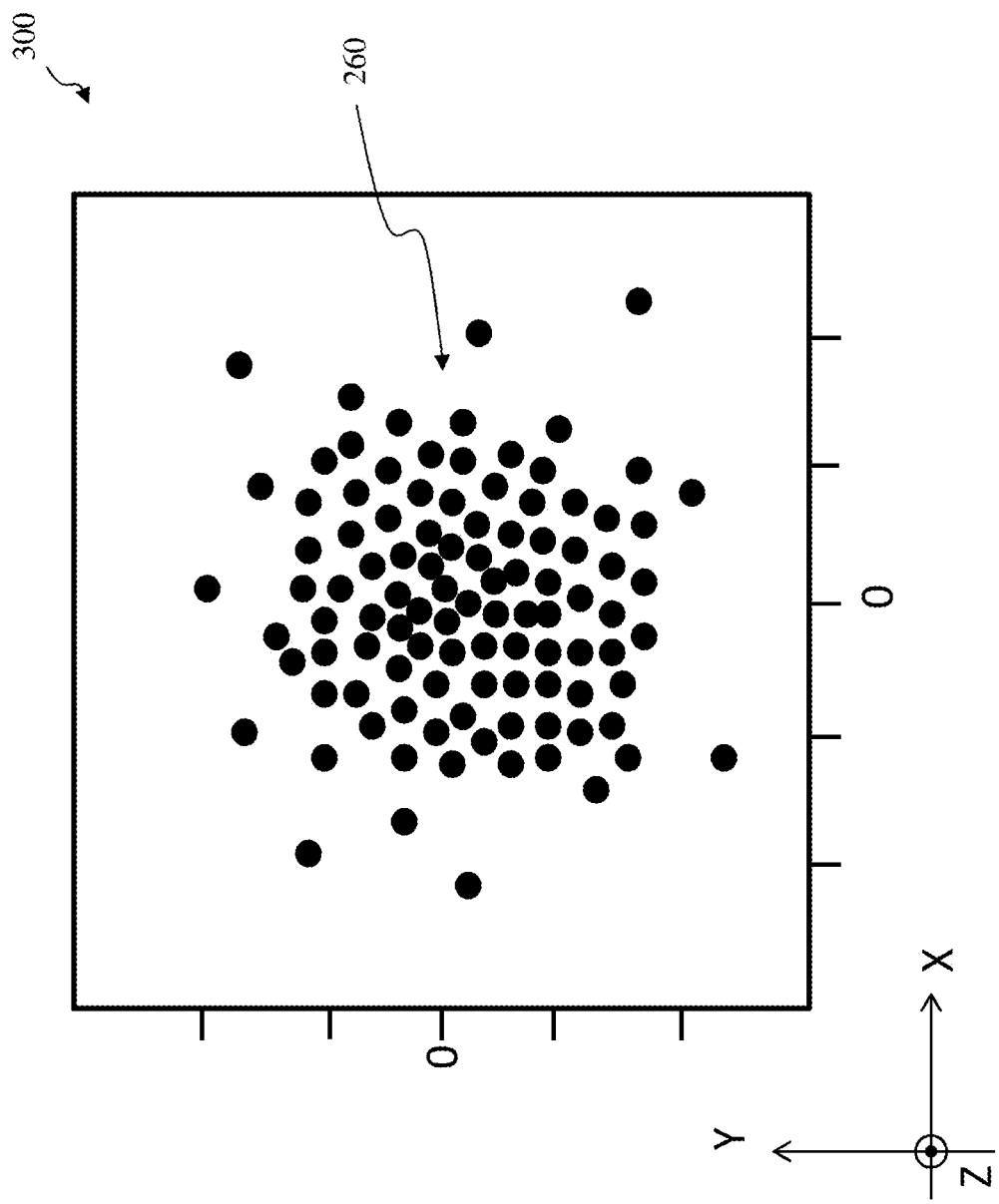
FIG. 3 is a schematic top view of a secondary electron distribution in a resist layer being radiated by EUV radiation in a lithography system in accordance with various aspects of the present disclosure, with the electric field shut off.

Reference is now made to FIG. 3, which illustrates a schematic top view of a secondary electron distribution 300 in the resist layer 200 being radiated by EUV in a lithography system, such as the lithography system 100, 160 and 180, with the electric field shut off. As shown in the secondary electron distribution 300, when viewed along the Z direction in FIGS. 2A and 2B, the secondary electrons 260 scatter along the X and Y directions and have an undesirably wide distribution on the X-Y plane.

Figure 5:
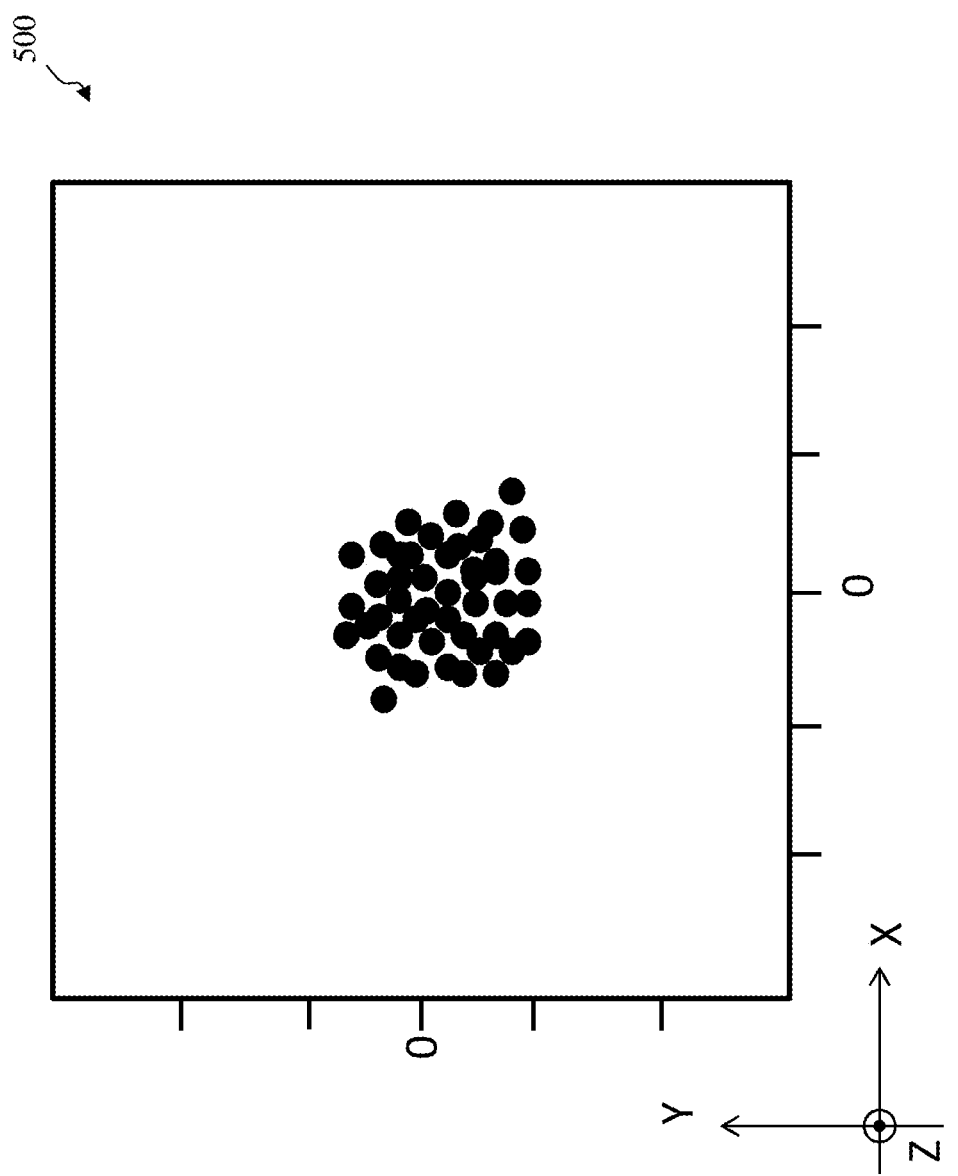
FIG. 5 illustrates a schematic top view of a scattering electron distribution in a resist layer being radiated by EUV radiation in a lithography system in accordance with various aspects of the present disclosure.

FIGS. 4A-4B illustrates schematic cross-sectional views of a secondary electrons in the resist layer 200 being radiated by the EUV light 136 in the lithography system 100/160 in FIGS. 1A and 1B. As shown in FIG. 4A, when the resist layer 200 is irradiated by the EUV light 136 in the target exposure area 138, a photon is absorbed by a component of the resist layer 200, such as the polymer matrix, and an electron 250 is generated. In some embodiments, prior to or simultaneously with irradiation of the EUV light 136, the power source 140 (shown in FIGS. 1A and 1B) is activated to output a DC signal and an DC electric field E1 is applied between the electrode 120/121 and the substrate stage 116. The DC electric field E1 may go through the semiconductor substrate 114, including through the resist layer 200. Due to the presence of the DC electric field E1, the electron 250 may have a tendency to travel along the −Z direction. For that reason, it may be less probable for the electron 250 to travel along the X or Y direction. Turning to FIG. 4B, in its predominantly downward course, the electron 250 may impact various components in the resist layer 200 and generates multiple secondary electrons 400. Affected by the DC electric field E1, the secondary electrons 400 may also have a tendency to propagate along the −Z direction and are less likely to travel along the X or Y direction. As a result, the secondary electrons 400 may have a spatial distribution that has a center more adjacent to the substrate stage 116. Also as a result of the application of the DC electric field E1, the spatial distribution of the secondary electrons 400 has a smaller area or footprint on the X-Y plane. The smaller footprint on the X-Y plane is illustrated in the distribution 500 of secondary electrons in FIG. 5. As compared to the secondary electron distribution 300 in FIG. 3, the distribution of secondary electrons in the X-Y plane is more convergent and dense in the distribution 500. In some implementations, the DC signal includes an amplitude between about 10 volts and about 20,000 volts.

Referring now to FIGS. 6A-6D, shown therein are schematic cross-sectional views of a secondary electron distribution in the resist layer 200 being radiated by the EUV radiation 136 in the lithography system 100/160 in accordance with various aspects of the present disclosure. As shown in FIG. 6A, when the resist layer 200 is irradiated by the EUV light 136 in the target exposure area 138, a photon is absorbed by a component of the resist layer 200, such as the polymer matrix, and an electron 250 is generated. In some embodiments, prior to or simultaneously with irradiation of the EUV light 136, the power source 140 (shown in FIGS. 1A and 1B) is activated to output an AC signal and an AC electric field E2 is applied between the electrode 120/121 and the substrate stage 116. The AC electric field E2 may switch between a positive phase and a negative phase and go through the semiconductor substrate 114, including through the resist layer 200. When the AC electric field E2 is at the positive phase as shown in FIG. 6A, the electron 250 may have a tendency to travel along the −Z direction. For that reason, it may be less probable for the electron 250 to travel along the X or Y direction. Turning to FIG. 6B, where the AC electric field E2 is still in the positive phase, in its predominantly downward course, the electron 250 may impact various components in the resist layer 200 and generates multiple secondary electrons 600. Affected by the AC electric field E2 in its positive phase, the secondary electrons 600 may also have a tendency to propagate along the −Z direction and are less likely to travel along the X or Y direction. As a result, the secondary electrons 600 may have a spatial distribution that has a center more adjacent to the substrate stage 116. Also as a result of the application of the AC electric field E2, the spatial distribution of the secondary electrons 600 has a smaller area or footprint on the X-Y plane.

In some embodiments represented in FIG. 6C, the AC electric field E2 switches to the negative phase. Affected by the AC electric field E2 in its negative phase, the secondary electrons 600 may have a tendency to propagate along the +Z direction and are less likely to travel along the X or Y direction. As a result, the secondary electrons 600 may now have a spatial distribution that has a center farther away from the substrate stage 116 as compared to the spatial distribution in the positive phase. In some implementations, the AC electric field E2 may again switch to the positive phase, as shown in FIG. 6D. Influenced by the AC electric field E2 in its positive phase, the secondary electrons 600 may tend to propagate along the −Z direction and the spatial distribution of the secondary electrons 600 may again move closer to the substrate stage 116. By switching back and forth between the positive phase and the negative phase, the AC electric field E2 may shift the spatial distribution of secondary electrons along the Z direction. The resulting exposed region may therefore have an area substantially similar to the target exposure area 138. In some instances, the AC signal includes a peak-to-peak amplitude between about 10 volts and about 40,000 volts.

Figure 7:
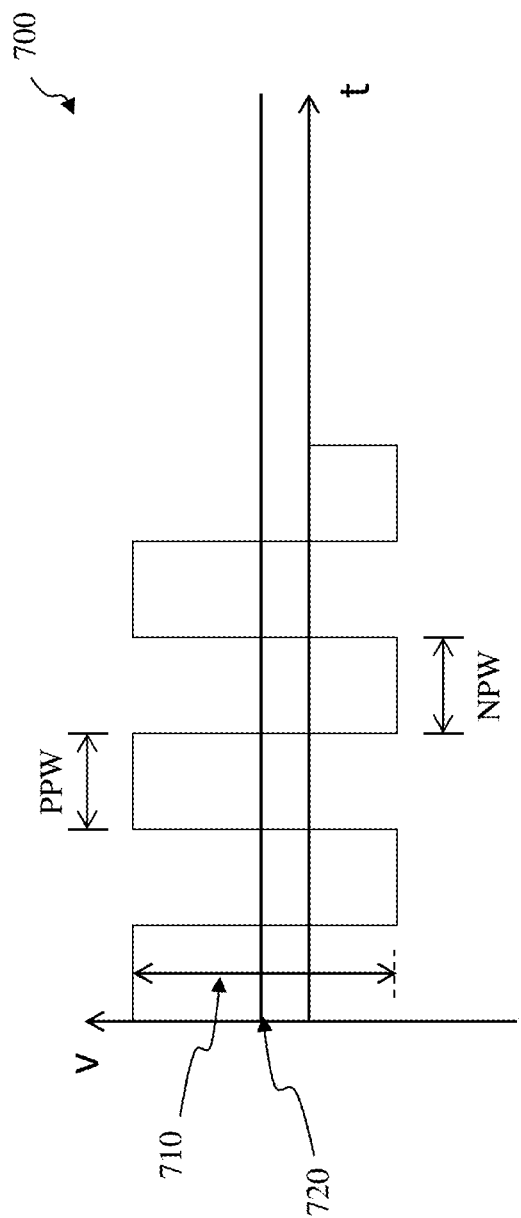
FIG. 7 is a schematic diagram illustrating an alternating current (AC) wave form used with a lithography system in accordance with various aspects of the present disclosure.

In some embodiments represented in FIG. 7, the AC signal of the power source 140 (shown in FIGS. 1A and 1B) may include a waveform 700. The waveform 700 may be square waves, sine waves, triangular waves, or complex waves. In embodiments represented in FIG. 7, the waveform 700 may include square waves. In these embodiments, the waveform 700 includes a peak-to-peak amplitude 710 centered at a DC offset 720 with a positive phase pulse width PPW and a negative phase pulse width NPW. In some implementations, the DC offset 720 may be between about 10 volts and 40,000 volts. In some instances, PPW and NPW may be identical. In some other instances, PPW and NPW may have different pulse widths. For example, PPW may be greater than NPW. In some implementations, the peak-to-peak amplitude 710 may be between about 10 volts and about 40,000 volts, such as between about 300 volts and about 40,000 volts. The AC signal may include a frequency between about 1.5K Hz and about 24G Hz. While example ranges of the DC offset 720, the peak-to-peak amplitude 710 and the frequency of the AC signal are provided herein, the embodiments of the present disclosure are not so limited. In some embodiments, the ranges may be lower or higher depending on the dimensions of the lithography system (e.g. the lithography systems 100, 160 and 180 shown in FIGS. 1A-1, 1A-2, 1B-1, 1B-2, 1C-1, and 1C-2) and/or properties of the resist layer (e.g. the resist layer 200 shown in FIGS. 1A-1, 1A-2, 1B-1, 1B-2, 1C-1, 1C-2, 2A, 2B, 4A, 4B, 6A-6D, 8A, and 8B).

Referring now to FIGS. 8A and 8B, shown therein are schematic cross-sectional views of a secondary electron distribution in the resist layer 200 being radiated by the EUV radiation 136 in the lithography system 180. As shown in FIG. 8A, when the resist layer 200 is irradiated by the EUV light 136 in the target exposure area 138, a photon is absorbed by a component of the resist layer 200, such as the polymer matrix, and an electron 250 is generated. In some embodiments, prior to or simultaneously with irradiation of the EUV light 136, the power source 140 (shown in FIGS. 1C-1 and 1C-2) is activated to output a DC signal and an electric field E3 is applied between the electrode 122 and the substrate stage 116. The electric field E3 may go through the semiconductor substrate 114, including through the resist layer 200. Due to the presence of the electric field E3, the electron 250 may have a tendency to travel along the −Z direction. For that reason, it may be less probable for the electron 250 to travel along the X or Y direction. Turning to FIG. 8B, in its predominantly downward course, the electron 250 may impact various components in the resist layer 200 and generates multiple secondary electrons 800. Affected by the electric field E3, the secondary electrons 800 may also have a tendency to propagate along the −Z direction and are less likely to travel along the X or Y direction. As a result, the secondary electrons 800 may have a spatial distribution that has a center more adjacent to the substrate stage 116. Also as a result of the application of the electric field E3, the spatial distribution of the secondary electrons 800 has a smaller area or footprint on the X-Y plane. In some other embodiments, the power source 140 (shown in FIGS. 1C-1 and 1C-2) in the lithography system 180 may output an AC signal and the electric field E3 is an AC electric field switching between a positive phase and a negative phase. In those embodiments, the AC electric field E3 may drive the spatial distribution of the secondary electrons 800 back and forth along the Z direction.

Figure 9:
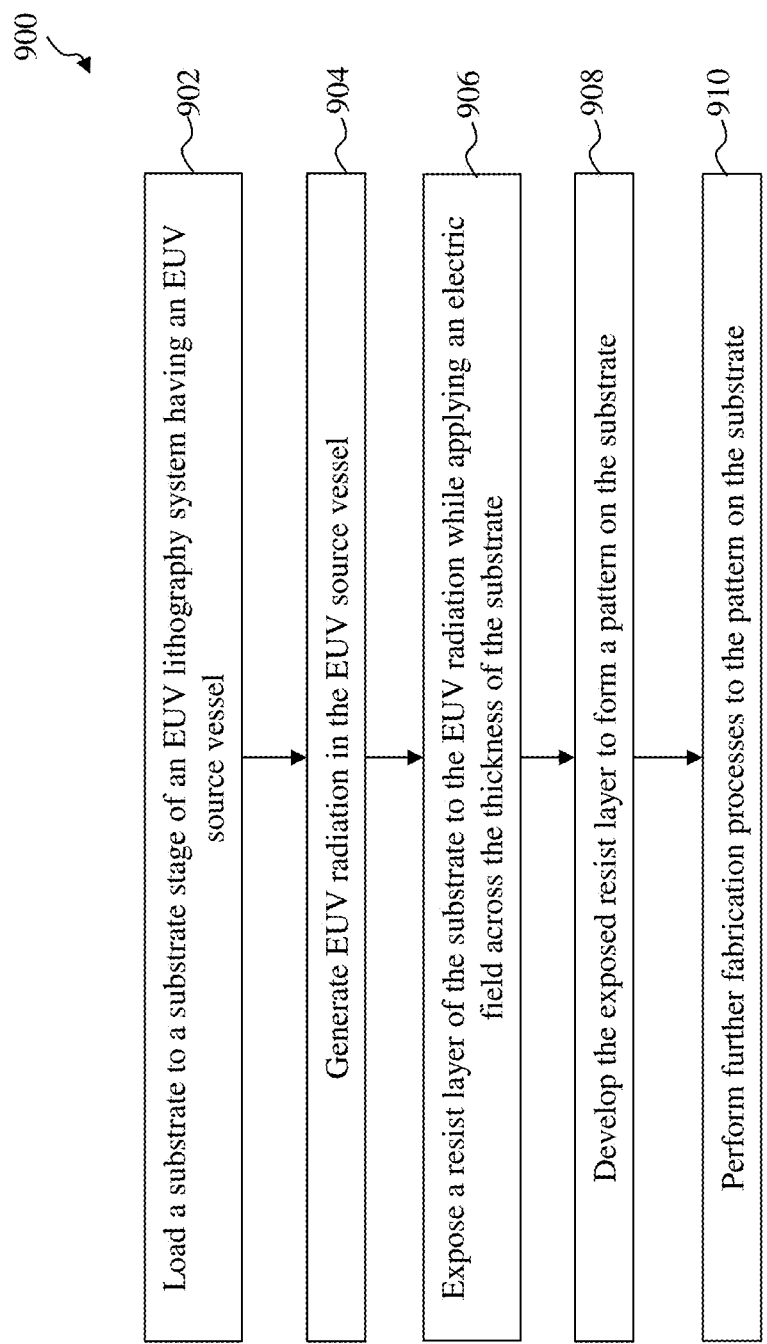
FIG. 9 is a flowchart of a method in accordance with various aspects of the present disclosure.

Reference is now made to FIG. 9, which illustrates a flowchart of a method 900 in accordance with various aspects of the present disclosure. The method 900 is merely an example, and is not intended to limit the present disclosure beyond what is explicitly recited in the claims. Additional operation may be provided before, during, and after the method 900, and some operations may be replaced, eliminated, or moved around for additional embodiments of the method. The method 900 is described below in conjunction with FIGS. 1A-8B described above.

With reference to FIG. 1A-1 to FIG. 1C-2, the method 900 of FIG. 9 begins at block 902 where a substrate, such as the semiconductor substrate 114, is loaded and secured on a substrate stage, such as the substrate stage 116 of a lithography system, such as the lithography system 100, 160, or 180. The lithography system may include a radiation source, such as the radiation source vessel 102. The method 900 then proceeds to block 904 where a radiation, such as the EUV radiation 136, is generated in the radiation source. With reference to FIG. 1A-1 to FIGS. 1C-2, 4A-4B and 6A-6D, the method 900 proceeds to block 906 where a resist layer of the substrate, such as the resist layer 200, is exposed to the radiation while an electric field, such as the DC electric field E1, the AC electric field E2 or the electric field E3, is applied across the thickness of the substrate along the Z direction in FIGS. 4A-4B and 6A-6D. At block 908, the exposed resist layer is developed to form a pattern on the substrate. In some embodiments, the pattern is formed on a material layer or a hard mask layer deposited on the substrate. In some implementations, the developing operation in block 908 is carried out by using a developer solution, such as a basic developer solution containing TMAH. At block 910, the method 900 continues by having further fabrication processes performed to the pattern on the substrate to form structures and features on the substrate. In some embodiment, the pattern may be transferred to another material layer or another mask layer. In some other embodiments, a spacer material may be conformally deposited on the substrate for self-aligned patterning.

By applying an electric field, such as the DC electric field E1, the AC electric field E2 or the electric field E3, across a thickness of a resist layer on a substrate, the systems and methods of the present disclosure reduce or alleviate secondary electron blur (SEB), thereby increasing the resolution of the lithography system. The electric field is applied between an electrode over a substrate stage and the substrate stage. The electrode of the present disclosure may be configured not to obstruct the radiation directed at the substrate secured on the substrate stage. By alleviating SEB, the methods and systems of the present disclosure also reduces LER and increase the precision of the lithography system. It is noted, while the embodiments of the present disclosure are described in the context of an EUV lithography system, they may be applied to lithography systems that utilize radiation sources that have a wavelength substantially less than 250 nm, such as a deep ultraviolet (DUV) light source or an electron beam (E-beam) light source. The DUV light source may include exciting a molecule of a noble gas, such as argon (Ar), krypton (Kr), or xenon (Xe), to react with a molecule of a halogen, such as fluorine (F) and chlorine (Cl).

Accordingly, the present disclosure provides many different embodiments for fabricating a semiconductor device. In one aspect, the present disclosure provides a lithography system. The lithography system includes a substrate stage configured to secure a substrate at a first vertical level, wherein the substrate is deposited with a resist layer thereon; at least one electrode positioned at a second vertical level above the first vertical level; and a power source configured to apply an electric field across the at least one electrode and the substrate stage, including across a thickness of the resist layer when the substrate is secured on the substrate stage. In some embodiments, the lithography system further includes a lower electrode positioned below the substrate stage, wherein the power source is configured to apply the electric field between the at least one electrode and the lower electrode. In some embodiments, the at least one electrode is positioned around a circumference of the substrate stage. In some embodiments, the at least one electrode comprises a conductive wire mesh. In some embodiments, the power source comprises a direct current (DC) power source. In some embodiments, the power source comprises an alternating current (AC) power source. In some embodiments, the lithography system further includes an extreme ultraviolet (EUV) radiation source configured to irradiate the resist layer when the substrate is secured on the substrate stage. In some embodiments, the lithography system further includes a projection optics module including a plurality of optic components, wherein one of the at least one electrode is positioned above at least one of the plurality of optic components.

In yet another aspect, the present disclosure provides an apparatus for applying a bias across a thickness of a substrate during a lithography operation using an extreme ultraviolet (EUV) radiation source. The apparatus includes a substrate stage configured to secure a substrate thereon; an upper electrode positioned over the substrate stage; a lower electrode positioned below the substrate stage; and a power source configured to apply an electric field between the upper electrode and the lower electrode and across the substrate stage, including across a thickness of the substrate when the substrate is secured on the substrate stage. In some embodiments, the apparatus further includes a projection optics module including a plurality of optic components, wherein the upper electrode is positioned over at least one of the plurality of optic components of the projection optics module. In some embodiments, the apparatus further includes a projection optics module including a plurality of optic components, wherein the upper electrode is positioned between at least one of the plurality of optic components and the substrate stage, wherein the upper electrode comprises a through hole shaped and configured to allow radiation from the projection optics module to reach the substrate when the substrate is secured on the substrate stage. In some embodiments, the power source comprises a direct current (DC) power source. In some embodiments, the power source comprises an alternating current (AC) power source. In some embodiments, the upper electrode is positioned around a circumference of the substrate stage. In some embodiments, the upper electrode is conical in shape. In some embodiments, at least one of the upper electrode and the lower electrode is larger than the substrate in area.

In yet another aspect, the present disclosure provides a method for performing lithography. The method includes securing a substrate on a substrate stage, the substrate being coated with a resist layer thereon; irradiating an EUV radiation on the resist layer; and contemporaneously with the irradiating of the EUV radiation, applying, by use of a power source, an electric field across a thickness of the resist layer. In some embodiments, the applying of the electric field across the thickness of the resist layer includes applying the electric field between an upper electrode positioned over the substrate secured on the substrate stage and a lower electrode position below the substrate stage. In some embodiments, the power source comprises an alternating current (AC) power source and the electric field comprises an AC electric field. In some embodiments, the power source comprises a direct current (DC) offset.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography system, comprising:
a substrate stage configured to secure a substrate at a first vertical level, wherein the substrate is deposited with a resist layer thereon;
at least one electrode positioned at a second vertical level above the first vertical level;
a power source configured to apply an electric field across the at least one electrode and the substrate stage, including across a thickness of the resist layer when the substrate is secured on the substrate stage; and a projection optics module including a plurality of optic components, wherein one of the at least one electrode is positioned above at least one of the plurality of optic components.

2. The lithography system of claim 1, further comprising a lower electrode positioned below the substrate stage, wherein the power source is configured to apply the electric field between the at least one electrode and the lower electrode.

3. The lithography system of claim 1, wherein the at least one electrode is positioned around a circumference of the substrate stage.

4. The lithography system of claim 1, wherein the at least one electrode comprises a conductive wire mesh.

5. The lithography system of claim 1, wherein the power source comprises a direct current (DC) power source.

6. The lithography system of claim 1, wherein the power source comprises an alternating current (AC) power source.

7. The lithography system of claim 1, further comprising an extreme ultraviolet (EUV) radiation source configured to irradiate the resist layer when the substrate is secured on the substrate stage.

8. The lithography system of claim 1, wherein the substrate stage is electrically coupled to the power source.

9. An apparatus for applying a bias across a thickness of a substrate during a lithography operation using an extreme ultraviolet (EUV) radiation source, the apparatus comprising:
- a substrate stage configured to secure a substrate thereon;
- an upper electrode positioned over the substrate stage;
- a lower electrode positioned below the substrate stage; and
- a power source configured to apply an electric field between the upper electrode and the lower electrode and across the substrate stage, including across a thickness of the substrate when the substrate is secured on the substrate stage.

10. The apparatus of claim 9, further comprising a projection optics module including a plurality of optic components, wherein the upper electrode is positioned over at least one of the plurality of optic components of the projection optics module.

11. The apparatus of claim 9, further comprising a projection optics module including a plurality of optic components, wherein the upper electrode is positioned between at least one of the plurality of optic components and the substrate stage,
wherein the upper electrode comprises a through hole shaped and configured to allow radiation from the projection optics module to reach the substrate when the substrate is secured on the substrate stage.

12. The apparatus of claim 9, wherein the power source comprises a direct current (DC) power source.

13. The apparatus of claim 9, wherein the power source comprises an alternating current (AC) power source.

14. The apparatus of claim 9, wherein the upper electrode is positioned around a circumference of the substrate stage.

15. The apparatus of claim 9, wherein the upper electrode is conical in shape.

16. The apparatus of claim 9, wherein at least one of the upper electrode and the lower electrode is larger than the substrate in area.

17. A method for performing lithography, comprising:
- securing a substrate on a substrate stage, the substrate being coated with a resist layer thereon;
- irradiating an EUV radiation on the resist layer; and
- contemporaneously with the irradiating of the EUV radiation, applying, by use of a power source, an electric field across a thickness of the resist layer,
- wherein the applying of the electric field across the thickness of the resist layer includes applying the electric field between an upper electrode positioned over the substrate secured on the substrate stage and a lower electrode positioned below the substrate stage.

18. The method of claim 17, wherein the power source comprises an alternating current (AC) power source and the electric field comprises an AC electric field.

19. The method of claim 18, wherein the power source comprises a direct current (DC) offset.

20. The method of claim 17, wherein the upper electrode is positioned around a circumference of the substrate stage.

* * * * *